United States Patent
Okamoto et al.

(10) Patent No.: US 11,561,854 B2
(45) Date of Patent: Jan. 24, 2023

(54) MEMORY SYSTEM

(71) Applicant: KIOXIA CORPORATION, Tokyo (JP)

(72) Inventors: Noboru Okamoto, Tokyo (JP); Toshikatsu Hida, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/464,552

(22) Filed: Sep. 1, 2021

(65) Prior Publication Data
US 2022/0245028 A1    Aug. 4, 2022

(30) Foreign Application Priority Data
Feb. 2, 2021  (JP) .............................. JP2021-014718

(51) Int. Cl.
| | |
|---|---|
| *G06F 11/10* | (2006.01) |
| *G11C 16/26* | (2006.01) |
| *G11C 16/20* | (2006.01) |
| *G11C 16/04* | (2006.01) |

(52) U.S. Cl.
CPC ...... *G06F 11/1068* (2013.01); *G11C 16/0483* (2013.01); *G11C 16/20* (2013.01); *G11C 16/26* (2013.01)

(58) Field of Classification Search
CPC . G06F 11/1068; G11C 16/0483; G11C 16/20; G11C 16/26
See application file for complete search history.

(56) References Cited

U.S. PATENT DOCUMENTS

| | | | |
|---|---|---|---|
| 9,799,405 B1 | 10/2017 | Micheloni et al. | |
| 10,102,920 B2 | 10/2018 | Reusswig et al. | |
| 10,545,691 B2* | 1/2020 | Suzuki | G06F 3/0619 |
| 2015/0149863 A1* | 5/2015 | Hashimoto | G11C 29/42 |
| | | | 714/764 |
| 2016/0042797 A1* | 2/2016 | Kim | G11C 16/3427 |
| | | | 714/764 |
| 2016/0239381 A1* | 8/2016 | Nakazumi | G11C 11/5642 |
| 2016/0246672 A1* | 8/2016 | Yang | G06F 3/064 |
| 2018/0173447 A1* | 6/2018 | Chin | G06F 3/0619 |
| 2019/0042343 A1* | 2/2019 | Khoueir | G06F 11/076 |
| 2019/0043566 A1* | 2/2019 | Wu | G11C 7/04 |
| 2019/0377634 A1* | 12/2019 | Jung | H03M 13/45 |
| 2019/0378565 A1 | 12/2019 | Yuan et al. | |
| 2021/0158861 A1* | 5/2021 | Jeong | G11C 11/40615 |

* cited by examiner

*Primary Examiner* — Guy J Lamarre

(74) *Attorney, Agent, or Firm* — Kim & Stewart LLP

(57) ABSTRACT

A memory system connectable to a host, includes a non-volatile memory including a plurality of memory cell transistors and a controller configured to execute read operations on the non-volatile memory. The controller executes one or more first read operations on the non-volatile memory to obtain read data using read voltages that are determined from one of a plurality of entries stored in a shift table, and performs error correction on the read data, until the error correction is successful, and when the error correction on the read data is successful, records an index corresponding to the entry stored in the shift table that was used in obtaining the successfully error-corrected read data. The controller executes a second read operation on the non-volatile memory to obtain read data using read voltages that are determined from the entry stored in the shift table corresponding to the recorded index.

19 Claims, 4 Drawing Sheets

| Pass/Fail table | INDEX NUMBER | Pass/Fail |
|---|---|---|
| Day 1 (Current) | 1 | Fail |
| Day 2 | 2 | Pass |
| Day 3 | 3 | Pass |
| Day 4 | 4 | Pass |
| Day 5 (Last) | 5 | Pass |

FIG. 7

| Pass/Fail table | INDEX NUMBER | Pass/Fail |
|---|---|---|
| Day 1 (Current) | 1 | Fail |
| Day 2 | 2 | Fail |
| Day 3 | 3 | Fail |
| Day 4 | 4 | Fail |
| Day 5 (Last) | 5 | Fail |

MEMORY SYSTEM

CROSS-REFERENCE TO RELATED APPLICATION

This application is based upon and claims the benefit of priority from Japanese Patent Application No. 2021-014718, filed Feb. 2, 2021, the entire contents of which are incorporated herein by reference.

FIELD

Embodiments described herein relate generally to a memory system.

BACKGROUND

In the related art, a memory system having a memory cell transistor is widely known. In a read operation in such a memory system, data stored in a memory cell transistor is determined based on comparison between a threshold voltage of the memory cell transistor and a read voltage.

However, a threshold voltage of the memory cell transistor changes depending on various factors. Therefore, the memory system is configured so that a value of the read voltage can be changed, and when erroneous reading of data occurs in the read operation, the value of the read voltage is changed, and the read operation is retried. On the other hand, the occurrence of erroneous reading of data and the retry of the read operation contribute to deterioration in read latency.

BRIEF DESCRIPTION OF THE DRAWINGS

FIG. 7 is a diagram illustrating another example of the pass/fail table used in the memory system according to the embodiment.

DETAILED DESCRIPTION

Embodiments provide a memory system with reduced deterioration in read latency.

In general, according to one embodiment, a memory system is connectable to a host and includes a non-volatile memory including a plurality of memory cell transistors, and a controller that executes read operations on the non-volatile memory. The controller executes one or more first read operations on the non-volatile memory to obtain read data using read voltages that are determined from one of a plurality of entries stored in a shift table, and performs error correction on the read data, until the error correction is successful, and when the error correction on the read data is successful, records an index corresponding to the entry stored in the shift table that was used in obtaining the successfully error-corrected read data. The controller executes a second read operation on the non-volatile memory to obtain read data using read voltages that are determined from the entry stored in the shift table corresponding to the recorded index.

Hereinafter, the memory system according to the embodiment will be described in detail with reference to the drawings. It is noted that the present disclosure is not limited to these embodiments.

(Configuration of Embodiment)

Figure 1:
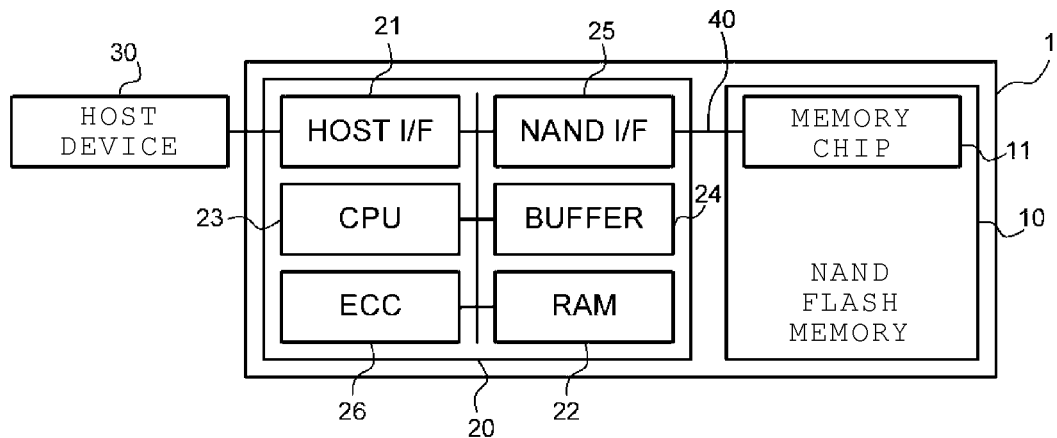
FIG. 1 is a block diagram illustrating a configuration of a memory system according to an embodiment, connected to a host device.

FIG. 1 is a diagram illustrating an example of a configuration of the memory system according to the embodiment. As illustrated in FIG. 1, a memory system 1 can be connected to a host device 30. The host device 30 is, for example, a server, a personal computer, or a mobile-type information processing device. The memory system 1 functions as an external storage device of the host device 30. The host device 30 can issue requests to the memory system 1. The requests include a read request and a write request.

The memory system 1 includes a NAND flash memory 10 and a controller 20. The NAND flash memory 10 includes a memory chip 11. The memory chip 11 includes a plurality of memory cell transistors and can store data in a non-volatile manner. The memory chip 11 is connected to the controller 20 via a NAND bus 40.

The controller 20 includes a host interface (HOST I/F) 21, a random access memory (RAM) 22, a central processing unit (CPU) 23, a buffer memory (BUFFER) 24, a NAND interface (NAND I/F) 25, and an ECC circuit (ECC) 26.

The controller 20 performs a program operation, a read operation, an erase operation, and the like on the NAND flash memory 10. The controller 20 is configured as, for example, a system-on-a-chip (SoC). The controller 20 may be also configured as a field-programmable gate array (FPGA) or an application specific integrated circuit (ASIC). The controller 20 may be also configured with a plurality of chips. Each function of the controller 20 may be implemented by the CPU 23 that executes software (firmware), as dedicated hardware, or as a combination thereof.

The host interface 21 is connected to the host device 30 via a bus conforming to, for example, a serial advanced technology attachment (SATA) standard, a serial attached SCSI (SAS) standard, or a peripheral components interconnect (PCI Express®) standard to implement communication between the controller 20 and the host device 30.

The NAND interface 25 is connected to the memory chip 11 of the NAND flash memory 10 via the NAND bus 40 to enable communication between the controller 20 and the memory chip 11.

The CPU 23 controls operations of the controller 20.

The RAM 22 provides a work area to the CPU 23. The buffer memory 24 temporarily stores the data transmitted to the memory chip 11 of the NAND flash memory 10 and the data received from the memory chip 11. The RAM 22 and the buffer memory 24 can be implemented by, for example, a dynamic random access memory (DRAM), a static random access memory (SRAM), or a combination thereof. It is noted that the types of memories that constitute the RAM 22 and the buffer memory 24 are not limited thereto. The buffer memory 24 may be implemented outside the controller 20.

The ECC circuit 26 detects errors in the data read out from the NAND flash memory 10 and corrects the detected errors by using an error correction code. When the error correction fails, the controller 20 changes the read voltage for the memory cell transistor and re-executes (retries) the read operation. Here, the failure in the error correction indicates that the data written to the NAND flash memory 10 cannot be restored from the data read out from the NAND flash memory 10. Specifically, the failure in the error correction indicates that an error bit contained in the read data cannot be corrected. The passing of the error correction indicates that all error bits contained in the read data are corrected. The controller 20 repeatedly executes retry read while changing the read voltage until the error correction has passed.

The change of the read voltage may be implemented by storing a shift table listing a combination of a plurality of read voltages in the RAM 22 and causing the controller 20 to refer to the shift table.

The value of the read voltage stored in the shift table can be represented in various quantities. In addition, the value of the read voltage can be indicated by various representations. For example, the value of the read voltage can be represented by a shift amount. The shift amount is a difference from a reference value set in advance for each type of the read voltage ($V_{Xday\_Y}$). The reference value may be recorded for each type of the read voltage at a predetermined position in the memory chip 11. Then, the controller 20 instructs the memory chip 11 of the shift amount from the reference value for each type of the read voltage.

It is noted that the method of representing the read voltage and the method of instructing the read voltage are not limited thereto. For example, the value of the read voltage may be represented by a voltage value instead of the difference, and the read voltage may be indicated to the memory chip 11 by a voltage value instead of the difference.

(Data Retention of Memory Transistor)

The memory system according to the embodiment reads the data stored in the memory cell transistor by comparing the threshold voltage of the memory cell transistor with the read voltage in the read operation. However, the threshold voltage of the memory cell transistor changes depending on various factors, such as passage of time. The memory system according to the embodiment is configured so that the value of the read voltage can be changed, and when the error correction is failed in the read operation, the value of the read voltage is changed, and the read operation is retried.

Figure 2:
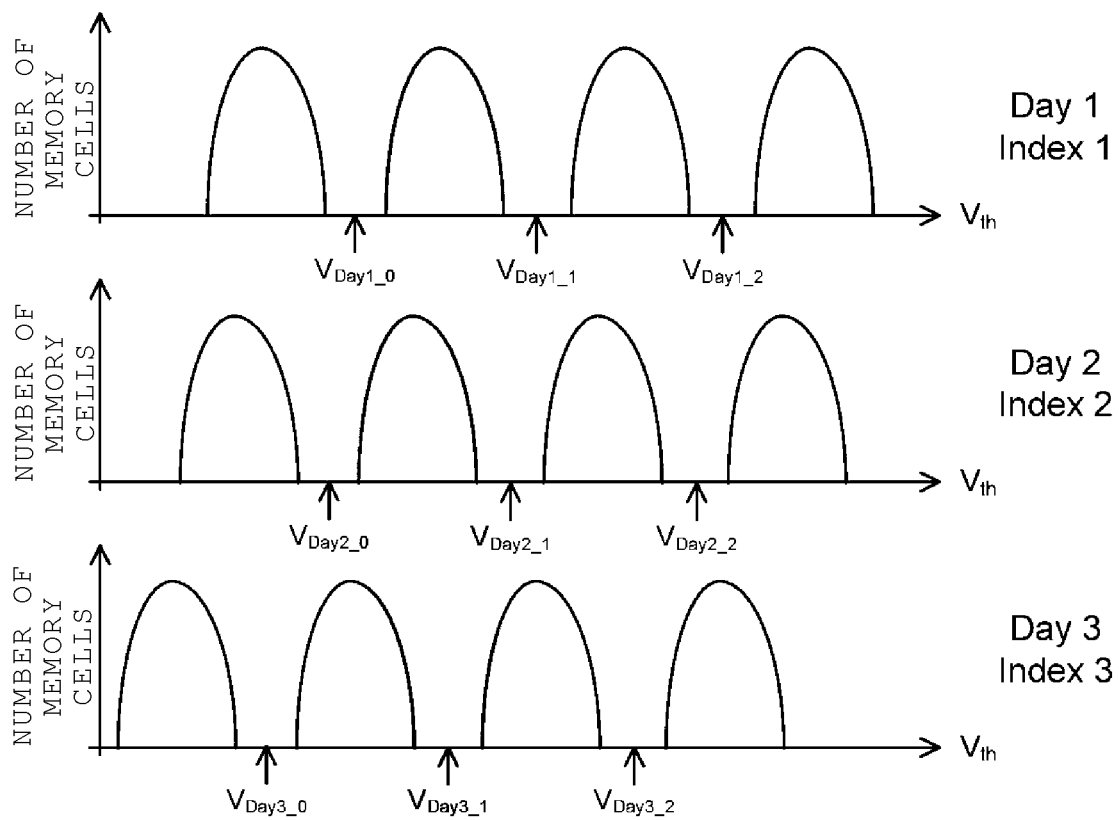
FIG. 2 is a diagram illustrating an example of a threshold voltage distribution of a memory cell transistor in the memory system according to the embodiment.

FIG. 2 illustrates an example of a threshold voltage distribution of the memory cell transistors in the memory system of the embodiment. The vertical axis of FIG. 2 represents the number of memory cells including the memory cell transistors, and the horizontal axis represents the threshold voltage. In the example illustrated in FIG. 2, the memory cell transistor has four threshold voltage states, and each memory cell transistor can store four-value data. "$V_{Day1\_0}$", "$V_{Day1\_1}$", and "$V_{Day1\_2}$" are defined as the read voltage in "Day1" immediately after the data is written to the memory cell transistor.

However, the threshold voltage distribution of the memory cell transistor shifts to, for example, lower voltages due to the passage of time or the like. In the example illustrated in FIG. 2, the threshold voltage distribution shifts from the threshold voltage distribution illustrated in "Day1" to a voltage range lower than that of "Day1" illustrated in "Day2" due to the passage of time or the like, and furthermore, shifts to even lower voltage range as illustrated in "Day3". When the read operation is performed on a memory cell transistor having a threshold voltage distribution of "Day3" in a state where the read voltages are "$V_{Day1\_0}$", "$V_{Day1\_1}$", and "$V_{Day1\_2}$", the threshold voltage distribution range and the read voltage overlap, the threshold voltage of a particular memory cell cannot be correctly identified. In order to perform the read operation in response to such a threshold voltage shift, it is necessary to change the read voltage "$V_{DayX\_Y}$".

Figures 3, 4:
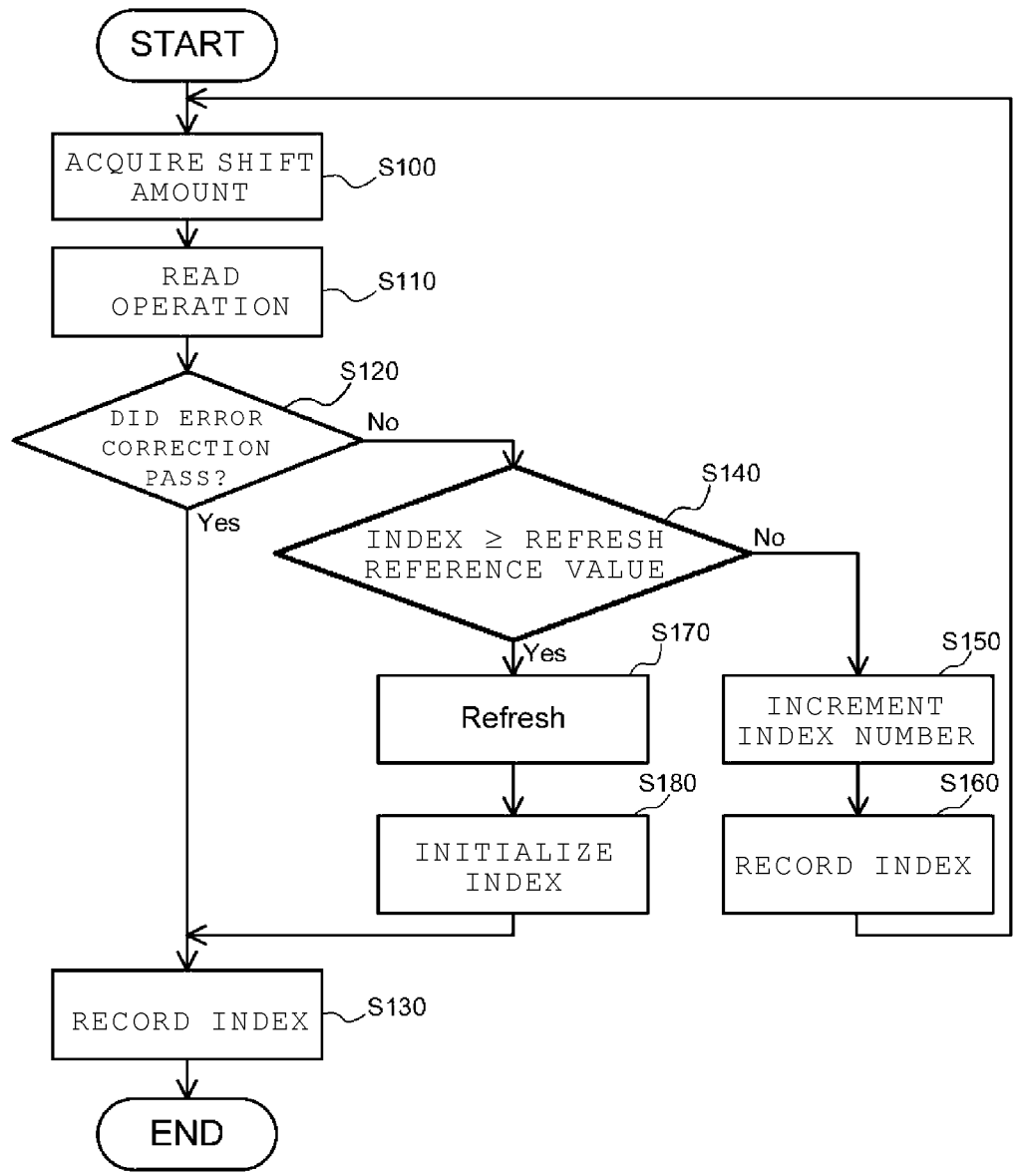
FIG. 3 is a flowchart illustrating an example of a patrol read operation in the memory system according to the embodiment.
FIG. 4 is a diagram illustrating an example of a shift table used in the memory system according to the embodiment.

Therefore, the combination of the read voltages "$V_{Day1\_0}$", "$V_{Day1\_1}$", and "$V_{Day1\_2}$" at the time of "Day1" is defined as "Index1". Similarly, the combination of the read voltages "$V_{Day2\_0}$", "$V_{Day2\_1}$", and "$V_{Day2\_2}$" at the time of "Day2" is defined as "Index2", and the combination of the read voltages "$V_{Day3\_0}$", "$V_{Day3\_1}$", and "$V_{Day3\_2}$" at the time of "Day3" is defined as "Index3". Then, when these "IndexX" are defined in the shift table, the combination of the read voltages can be changed all at once by changing the number in the "IndexX" (that is, X). The shift table is stored in the RAM 22 as described above. FIG. 4 illustrates an example of the shift table.

The combination of the read voltages is changed when the error correction in the ECC circuit 26 fails. However, when the error correction fails during the read operation carried out in response to an instruction from the host device 30, and the combination of the read voltages is changed, read latency is caused to be deteriorated. Therefore, in the memory system according to the embodiment, the patrol read operation is executed in the background, and the combination of the read voltages is changed to the optimum one. In the patrol read operation, the index in the shift table is updated.

In the shift table referred to when the read operation is executed, shift patterns (shift amounts in the example of FIG. 4) of the corresponding read voltage are arranged in the order corresponding to the progress of the change of the threshold voltage. The shift amounts a to c are values that relatively indicate the read voltage VDayX_Y illustrated in FIG. 2. The indexes having the values corresponding to the order of the arrangement are attached to the respective shift patterns. That is, the value of the index indicates a rank corresponding to the progress of the change of the threshold voltage.

For example, a first degree in which the change of the threshold voltage progresses and a second degree in which the change progresses more than the first degree are considered. A first shift pattern corresponding to the first degree is set to a lower rank than a second shift pattern corresponding to the second degree. In FIG. 4, for example, 1 is set for value of the index corresponding to the first shift pattern, and 2 is set for value of the index corresponding to the second shift pattern.

When the retry read is repeated, the controller 20 selects the shift pattern applied to each retry read in the order of the values of the indexes. When the value of the index used in the read operation is changed, the value is stored as a history index in the RAM 22.

Alternatively, a tendency of the progress of the change of the threshold voltage can be estimated in advance by a designer. That is, in the shift table, the shift patterns are arranged in the order corresponding to the progress of the change of the threshold voltage estimated in advance by the designer. For example, the progress of the change of the threshold voltage can be estimated in consideration of the phenomenon that electric charges are discharged from the memory cell transistor. The progress of the change of the threshold voltage due to the phenomenon that the electric charges are discharged from the memory cell transistor differs depending on, for example, the number of executions of the erase operation and the program operation. Other shift tables may be provided according to the number of times of execution of the erase operation and the program operation.

(Patrol Read Operation)

The patrol read operation in the memory system according to the embodiment will be described with reference to FIG. 3. The controller 20 executes the patrol read operation on a regular basis (for example, once every 3 to 4 days). The execution frequency of the patrol read operation by the controller 20 is determined in consideration of the capacity of the NAND flash memory 10 and the like.

The controller 20 reads the shift table from the RAM 22 and acquires a shift amount corresponding to a predetermined index (history index) (S100). In the example of the shift table illustrated in FIG. 4, the controller 20 reads, for example, the shift amounts a to c corresponding to Index1 at the initial stage.

The controller 20 executes the read operation based on the acquired shift amount (S110).

The ECC circuit 26 performs the error correction on the data acquired by the read operation (S120). When there is no error or the error correction has passed (Yes in S120), the controller 20 stores the index (herein, for example, Index1 in this case) used for the read operation as the history index in the RAM 22 (S130).

When the error correction has failed (No in S120), the controller 20 compares the index used for the read operation with a refresh reference value (S140). The refresh reference value is an indicator for determining whether to perform a refresh operation on the region of the NAND flash memory 10 that has been subjected to the read operation. In the example illustrated in FIG. 4, the refresh reference value is, for example, Index5. The controller 20 refreshes the read operation region and re-stores the information when the change of the read voltage by the shift table exceeds a predetermined reference number of times. When the index used for the read operation is smaller than the refresh reference value (No in S140), the controller 20 increments the index number used for the read operation by 1 (S150) and stores the index number as the history index in the RAM 22 (S160). That is, in the example illustrated in FIG. 4, the index used in the next patrol read operation is set to Index2. In the next read operation, the shift amount corresponding to Index2 is used.

When the index used for the read operation is the refresh reference value or more (Yes in S140), the controller 20 refreshes the region in which the read operation has been performed (S170). When the refresh operation is executed, the controller 20 resets the index to an initial value (for example, Index1 in FIG. 4) (S180). The controller 20 stores the initial value of the index as the history index in the RAM 22 (S130). The controller 20 performs the processes described above for all the memory chips 11.

In the patrol read operation described with reference to FIGS. 3 and 4, each time the error correction of the data obtained by the read operation has failed, the history index is updated, and the optimum index is set in advance. Therefore, it is possible to reduce the possibility of failure in the error correction during the read operation according to the request from the host device 30. That is, the Quality of Service (QoS) of the memory system 1 can be improved.

(Modified Example of Patrol Read Operation)

The patrol read operation illustrated in FIG. 3 is a patrol read operation executed in the background, and thus, the possibility of the error occurrence and the retry occurrence during the read operation according to the request from the host device 30 can be reduced.

On the other hand, in the shift table, the shift patterns are generally arranged in the order corresponding to the progress of the change of the threshold voltage estimated in advance by the designer. However, in an actual memory system, due to variations in cell characteristics, or the like, although the error correction has passed, in some cases, the index (index with a large index number) that precedes the index used at that time may be a combination of more appropriate read voltages. In this case, there is a concern that the error correction may fail during the read operation according to the request from the host device 30 due to the passage of time from the time when the patrol read operation is performed. On the other hand, when the index on the shift table is updated earlier than necessary, the period until the next refresh operation may be shortened. Although it can be considered that detailed index updating can be performed by increasing the frequency of the patrol read operation, this causes a background process of the controller 20 to be executed more often than necessary, and thus, there is a concern that the read operation by the host device 30 may be hindered. In particular, as the capacity of the NAND flash memory 10 increases, such problems become more significant.

Figures 5, 6:
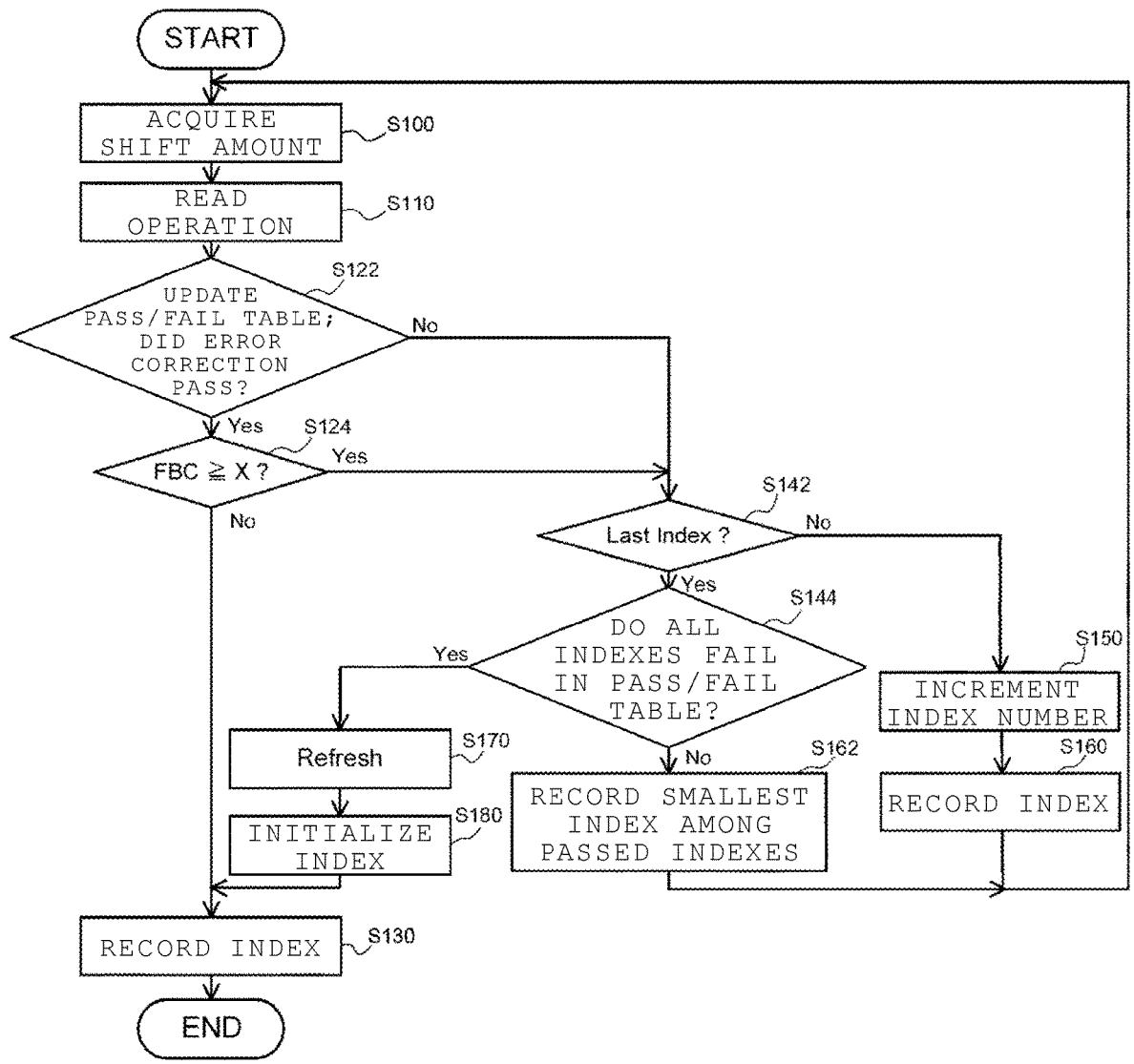
FIG. 5 is a flowchart illustrating another example of the patrol read operation in the memory system according to the embodiment.
FIG. 6 is a diagram illustrating an example of a pass/fail table used in the memory system according to the embodiment.

FIG. 5 illustrates a modified example in which a portion of the patrol read operation illustrated in FIG. 3 is performed. In the example illustrated in FIG. 5, an attempt is made to optimize the index early, and the refresh operation is not performed more often than necessary. Hereinafter, the modified example of the patrol read operation will be described in detail with reference to FIG. 5.

In the modified example, the controller 20 compares the number of error bits (Fail Bit Count) detected when the ECC circuit 26 performs the error correction with a predetermined reference value. That is, even if the error correction has passed, when the number of error bits exceeds the predetermined reference value, the index updating of the shift table is performed. This treatment serves to facilitate early optimization of the index in the shift table.

In addition, in the modified example, the controller 20 stores a pass/fail table in the RAM 22. FIG. 6 illustrates an example of the pass/fail table. As illustrated in FIG. 6, the pass/fail table is information in which the index in the shift table and the pass or fail in the error correction in the index are correlated with each other. The controller 20 acquires the combination of the read voltages from the shift table with reference to the index and records the pass or fail in the error correction in the read operation at that time in the pass/fail table. The pass/fail table is information for optimizing the execution of the refresh operation.

The controller 20 reads the shift table from the RAM 22 and acquires the shift amount corresponding to the predetermined index (S100). In the example of the shift table illustrated in FIG. 4, the controller 20 reads, for example, the shift amounts a to c corresponding to Index1 at the initial stage.

The controller 20 executes read operation based on the acquired shift amount (S110).

The ECC circuit 26 performs the error correction on the data acquired by the read operation (S122). The ECC circuit 26 updates the pass/fail table stored in the RAM 22. At this time, the ECC circuit 26 also acquires the number of error bits (Fail Bit Count) for the data which the error correction is performed on.

When there is no error as a result of the error correction operation, or when the error correction has passed (Yes in S122), the ECC circuit 26 determines whether or not the number of acquired error bits (failed-bit count) is a predetermined reference value X or more (S124). As a result of the determination, when the number of acquired error bits is less than the predetermined reference value X (No in S124), the controller 20 stores the index (herein, Index1) used for the read operation as the history index in the RAM 22 (S130).

When the error correction has failed (No in S122), or when the number of acquired error bits reaches a predetermined reference value X (Yes in S124), the controller 20 determines whether not the index used for the read operation is the last Index in the shift table (S142). When the index is not a last index (No in S142), the controller 20 increments the index number used for the read operation by 1 (S150) and stores the index number as the history index in the RAM 22 (S160). That is, in the example illustrated in FIG. 4, the controller 20 sets the index used in the next patrol read operation to Index2. The read based on the number of error bits acts to update the index of the shift table even when the error correction is passed.

When the index used for the read operation is the last index in the shift table (Yes in S142), the controller 20 refers to the pass/fail table stored in the RAM 22 and determines whether not the read operation using all the indexes fails the error correction (S144). When the index that has passed the error correction is recorded in the pass/fail table, the index with the smallest number among the passed indexes is stored as the history index in the RAM 22 (S162).

As described above, even when the index used for the error correction reaches the last index (Yes in S142), the index updating of the shift table is performed. In such a case, the youngest (smallest) index among the indexes that have passed the error correction is stored as the history index. Accordingly, it is possible to prevent the refresh operation from being performed more often than necessary.

For example, in the pass/fail table illustrated in FIG. 6, Index1 has failed the error correction, but Index2 having the next largest number has passed the error correction. Therefore, the controller 20 records Index2 as the history index in step S162.

In the pass/fail table, when there is no index that has passed the error correction and the read operation using all the indexes has failed the error correction (Yes in S144), the controller 20 executes the refresh operation in the area of the NAND flash memory 10 in which the read operation has been performed (S170). For example, in the pass/fail table illustrated in FIG. 7, the error correction has failed with respect to all the indexes of from the current Index1 to the last Index5. Therefore, the controller 20 executes the refresh operation in step S170. When the refresh operation is executed, the controller 20 resets the index to the initial value (for example, Index1 in FIG. 4) and initializes the pass/fail table (S180). The controller 20 stores the initial value of the index in the RAM 22 as the history index (S130).

The controller 20 performs the above-described processes on all the memory chips 11.

As described above, in the memory system according to the modified example, the updating of the index in the patrol read operation executed in the background is performed by using not only the pass/fail information in the error correction but also the number of error bits. Therefore, the index can be updated early, and the timing of refresh operation can be optimized (for example, the timing is delayed as much as possible). Therefore, it is possible to reduce the failure in the read operation by the host device 30.

Furthermore, in step S162, the controller 20 may store the index number of which the number of error bits is the smallest among the indexes that have passed the error correction as the history index. Accordingly, a data retention period can be extended.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system connectable to a host, the memory system comprising:
   a non-volatile memory including a plurality of memory cell transistors; and
   a controller configured to execute read operations on the non-volatile memory, wherein
   the controller is configured to execute one or more first read operations on the non-volatile memory to obtain read data using read voltages that are determined from one of a plurality of entries stored in a shift table, and perform error correction on the read data, until the error correction is successful, and when the error correction on the read data is successful, record an index corresponding to the entry stored in the shift table that was used in obtaining the successfully error-corrected read data, and
   the controller is configured to execute a second read operation on the non-volatile memory to obtain read data using read voltages that are determined from the entry stored in the shift table corresponding to the recorded index.

2. The memory system according to claim 1, wherein
   the first read operations are patrol read operations that are executed periodically and not in response to an instruction from a host, and
   the second read operation is a read operation that is executed in response to the instruction from the host.

3. The memory system according to claim 1, wherein
   the shift table includes at least first and second entries, and
   when the error correction on the read data obtained using the first entry is not successful, another first read operation is executed using the second entry.

4. The memory system according to claim 3, wherein the read voltages determined from the first entry are on average higher than the read voltages determined from the second entry.

5. The memory system according to claim 4, wherein the shift table includes a third entry, and the read voltages determined from the third entry are on average lower than the read voltages determined from any of the other entries of the shift table.

6. The memory system according to claim 5, wherein the controller is configured to execute a refresh operation on the nonvolatile memory if the error correction performed on the read data obtained using the read voltages determined from the third entry is not successful.

7. The memory system according to claim 6, wherein
   the read voltages determined from the first entry are on average higher than the read voltages determined from any of the other entries of the shift table, and
   the controller is configured to record an index associated with the first entry after the refresh operation.

8. The memory system according to claim 1, wherein the entries of the shift table are ranked and the first read operations are executed for each different entry in order according to the rank thereof.

9. A memory system connectable to a host, the memory system comprising:
a non-volatile memory including a plurality of memory cell transistors; and
a controller configured to execute read operations on the non-volatile memory, wherein
the controller is configured to execute one or more first read operations on the non-volatile memory to obtain read data using read voltages that are determined from one of a plurality of entries stored in a shift table, and perform error correction on the read data, until the error correction is successful and a failed-bit count in the error correction is less than a threshold, and when the error correction on the read data is successful and the failed-bit count in the error correction is less than the threshold, record an index corresponding to the entry stored in the shift table that was used in obtaining the successfully error-corrected read data, and
the controller is configured to execute a second read operation on the non-volatile memory to obtain read data using read voltages that are determined from the entry stored in the shift table corresponding to the recorded index.

10. The memory system according to claim 9, wherein the first read operations are patrol read operations that are executed periodically and not in response to an instruction from a host, and
the second read operation is a read operation that is executed in response to the instruction from the host.

11. The memory system according to claim 9, wherein the shift table includes at least first and second entries, and
when the error correction on the read data obtained using the first entry is not successful or the failed-bit count in the error correction is not less than the threshold, another first read operation is executed using the second entry.

12. The memory system according to claim 11, wherein the read voltages determined from the first entry are on average higher than the read voltages determined from the second entry.

13. The memory system according to claim 12, wherein the shift table includes a third entry, and the read voltages determined from the third entry are on average lower than the read voltages determined from any of the other entries of the shift table.

14. The memory system according to claim 13, wherein the controller is configured to track for each entry of the shift table whether or not read data obtained using read voltages determined therefrom passed or failed error correction.

15. The memory system according to claim 14, wherein the controller is configured to execute a refresh operation on the nonvolatile memory if the error correction performed on the read data obtained using the read voltages determined from the third entry is not successful or the failed-bit count in the error correction is not less than the threshold, and all of the read data obtained using read voltages determined from the entries of the shift table failed error correction.

16. The memory system according to claim 15, wherein
the read voltages determined from the first entry are on average higher than the read voltages determined from any of the other entries of the shift table, and
the controller is configured to record an index associated with the first entry after the refresh operation.

17. The memory system according to claim 14, wherein
if one or more of the read data obtained using read voltages determined from the entries of the shift table passed error correction, and if the error correction performed on the read data obtained using the read voltages determined from the third entry is not successful or the failed-bit count in the error correction is not less than the threshold, the controller records an index corresponding to the entry stored in the shift table that was used in obtaining the successfully error-corrected read data.

18. The memory system according to claim 17, wherein if two or more of the read data obtained using read voltages determined from the entries of the shift table passed error correction, the index corresponding to the entry of the shift table that was used in determining read voltages that are on average the highest, is recorded.

19. The memory system according to claim 9, wherein the entries of the shift table are ranked and the first read operations are executed for each different entry in order according to the rank thereof.

* * * * *